United States Patent
Carter et al.

(10) Patent No.: US 6,333,141 B1
(45) Date of Patent: *Dec. 25, 2001

(54) PROCESS FOR MANUFACTURE OF INTEGRATED CIRCUIT DEVICE USING INORGANIC/ORGANIC MATRIX COMPRISING POLYMERS OF THREE DIMENSIONAL ARCHITECTURE

(75) Inventors: Kenneth Raymond Carter; Richard Anthony Dipietro, both of San Jose; Craig Jon Hawker, Los Gatos; James Lupton Hedrick, Pleasanton; Victor YeeWay Lee, San Jose; Robert Dennis Miller, San Jose; Willi Volksen, San Jose; Do Yeung Yoon, Los Gatos, all of CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 286 days.

(21) Appl. No.: 09/111,840

(22) Filed: Jul. 8, 1998

(51) Int. Cl.[7] .................................................... G03C 5/00
(52) U.S. Cl. .................... 430/314; 430/320; 430/330; 430/322; 430/317; 430/272.1
(58) Field of Search .................... 430/313, 317, 430/318, 320, 270.1, 272.1, 330, 314

(56) References Cited

U.S. PATENT DOCUMENTS

| | | |
|---|---|---|
| 3,547,839 | 12/1970 | Tocker . |
| 3,732,181 | 5/1973 | Ray et al. . |
| 3,900,320 | 8/1975 | Rolker et al. . |
| 3,917,761 | 11/1975 | Scheuerlein et al. . |
| 4,141,877 | 2/1979 | Luttinger et al. . |

(List continued on next page.)

FOREIGN PATENT DOCUMENTS

| | | |
|---|---|---|
| 0 755 957 A1 | 1/1997 | (EP) . |
| 0 524 930 B1 | 3/1997 | (EP) . |
| 2 006 643 | 5/1979 | (GB) . |
| 63-172741 | 7/1988 | (JP) . |

(List continued on next page.)

OTHER PUBLICATIONS

Allen, G. et al., *Comprehensive Polymer Science. The Synthesis, Characterization, Reactions& Applications of Polymers*, vol. 1, pp. 17–18 and 34–37, Pergamon Press (Date Unknown).

Allen, G. et al., *Comprehensive Polymer Science. The Synthesis, Characterization, Reactions& Applications of Polymers*, vol. 3, pp. 34–37, Pergamon Press (Date Unknown).

*Encyclopedia of Polymer Science and Engineering. Anionic Polymerization to Cationic Polymerization*, "Block Copolymers", 2:324–327, a Wiley–Interscience Publication (Date Unknown).

Fang, T. et al., "Polycyanate Esters: Science and Applications", *Prog. Polym. Sci.*, 20:61–118 (1995).

(List continued on next page.)

Primary Examiner—Janet Baxter
Assistant Examiner—Yvette M. Clarke
(74) Attorney, Agent, or Firm—Scully, Murphy Murphy & Presser; Daniel P. Morris (57) ABSTRACT

The invention relates to a process for forming an integrated circuit device comprising (i) a substrate; (ii) metallic circuit lines positioned on the substrate and (iii) a dielectric material positioned on the circuit lines. The dielectric material comprises porous organic polysilica.

16 Claims, 3 Drawing Sheets

U.S. PATENT DOCUMENTS

| | | |
|---|---|---|
| 4,457,972 | 7/1984 | Griffith et al. . |
| 4,535,099 | 8/1985 | Lee et al. . |
| 4,623,463 | 11/1986 | Ford et al. . |
| 4,725,662 * | 2/1988 | Kuga et al. .............................. 528/80 |
| 4,761,233 | 8/1988 | Linder et al. . |
| 4,920,402 | 4/1990 | Nakaya et al. . |
| 5,036,145 | 7/1991 | Echterling et al. . |
| 5,043,369 | 8/1991 | Bahn et al. . |
| 5,114,826 | 5/1992 | Kwong et al. . |
| 5,130,025 | 7/1992 | Lefebvre et al. . |
| 5,136,014 * | 8/1992 | Figuly .................................. 528/272 |
| 5,183,607 | 2/1993 | Beall et al. . |
| 5,188,777 | 2/1993 | Joesten et al. . |
| 5,198,203 | 3/1993 | Kresge et al. . |
| 5,206,337 | 4/1993 | Takeda et al. . |
| 5,252,654 | 10/1993 | David et al. . |
| 5,288,842 | 2/1994 | Feger et al. . |
| 5,304,515 | 4/1994 | Morita et al. . |
| 5,384,376 | 1/1995 | Tunney et al. . |
| 5,412,016 | 5/1995 | Sharp . |
| 5,412,160 | 5/1995 | Yasumoto et al. . |
| 5,420,232 | 5/1995 | Dawson et al. . |
| 5,461,003 | 10/1995 | Havemann et al. . |
| 5,470,801 | 11/1995 | Kapoor et al. . |
| 5,498,689 | 3/1996 | Furuta et al. . |
| 5,521,424 | 5/1996 | Ueno et al. . |
| 5,523,615 | 6/1996 | Cho et al. . |
| 5,633,034 | 5/1997 | Carter et al. . |
| 5,658,994 | 8/1997 | Burgoyne, Jr. et al. . |
| 5,747,381 | 5/1998 | Wu et al. . |
| 5,767,014 | 6/1998 | Hawker et al. . |
| 5,773,197 | 6/1998 | Carter et al. . |
| 5,883,219 * | 3/1999 | Carter et al. .......................... 528/310 |
| 5,895,263 * | 4/1999 | Carter et al. .......................... 438/624 |
| 6,093,636 * | 7/2000 | Carter et al. .......................... 438/623 |

FOREIGN PATENT DOCUMENTS

| | | |
|---|---|---|
| 63-278943 | 11/1988 | (JP) . |
| 05205526 | 8/1993 | (JP) . |
| WO 97/01593 | 1/1997 | (WO) . |
| WO 97/10193 | 3/1997 | (WO) . |

OTHER PUBLICATIONS

Frechet, J. et al., "Synthesis and Properties of Dendrimers and Hyperbranched Polymers", *Comprehensive Polymer Science*, Second Supplement, pp. 71–132, Pergamon (Date Unknown).

Gauthier, M. et al., "Uniform Highly Branched Polymers by Anionic Grafting: Arborescent Graft Polymers", *Macromolecules*, 24:4548–4553 (1991).

Tian, D. et al., "Ring–Opening Polymerization of 1,4,8–Trioxaspiro[4,6]–9–undecanone: A New Route to Aliphatic Polyesters Bearing Functional Pendent Groups", *Macromolecules*, 30:406–409 (1997).

Tomalia, D. et al., "Comb–Burst Dendrimer Topology. New Macromolecular Architecture Derived from Dendritic Grafting", *Macromolecules*, 24: 1435–1438 (1991).

Tomalia, D. et al., "Genealogically Directed Synthesis: Starburst/Cascade Dendrimers and Hyperbranched Structures", *Topics in Current Chemistry*, 165:193–313 (1993).

Babich, E. et al., "Low Viscosity and High Temperature Stable Gap Filling Material for Glass/Ceramic Substrates", *IBM Technical Disclosure Bulletin*, 37(7):595–597 (Jul. 1994).

Chujo, Y., "Organic/Inorganic Polymer Hybrids", *Polymeric Materials Encyclopedia*, 6:4793–4798 (1996).

Chujo, Y. et al., "Organic Polymer Hybrids with Silica Gel Formed by Means of the Sol–Gel Method", *Advances in Polymer Science*, 100:11–29 (Feb. 25, 1991).

Hedrick, J., "Poly(aryl ether benzothiazoles)", *Macromolecules*, 24:6361–6364 (1991).

Hilborn, J. et al., "Poly(aryl ether–benzoxazoles)", *Macromolecules*, 23(11):2854–2861 (1990).

Homma, T. et al., "Stability of a new Polyimide Siloxane Film as Interlayer Dielectrics of ULSI Multilevel Interconnections", *Thin Solid Films*, 235:80–85 (1993).

Joseph, W. et al., "Synthesis of Bis–A Based Polybenzoxazoles via Acid–Catalyzed Solution Cyclization", *Polymer Reprints*, 33(1):501–502 (Apr. 1992).

Joseph, W. et al., "Synthesis of 4,4'–Isopropylidene Diphenol (Bisphenol A) Based Polybenzoxazoles via an Acid–Catalysed Solution Cyclization Process", *Polymer*, 34(4) (1993).

Joseph, W. et al., "Synthesis and Characterization of Fluorinated Polybenzoxales via Solution Cyclization Techniques", *Polymer Preprints*, 34(1):397–398 (Mar. 1993).

Joseph, W. et al., "Synthesis and Characterization of Fluorinated Polybenzoxazoles via Solution Cyclization Techniques", *Polymer*, 35(23):5046–5050 (1994).

Mascia, L., "Developments in Organic–Inorganic Polymeric Hybrids: Ceramers", *Trends in Polymer Science*, 3(2):61–66 (Feb. 1996).

McDermott, C., "Foamed Thermoset and Thermoplastic Polymer Combinations", *IBM Technical Disclosure Bulletin*, 8(12):1702 (May 1966).

Morikawa, A. et al., "Preparation of a New Class of Polyimide–Silica Hybrid Films by Sol–Gel Process", *Polymer Journal*, 24(1):107–113 (1992).

Morikawa, A. et al., "Preparation of New Polyimide–Silica Hybrid Materials via the Sol–Gel Process", *J. Mater. Chem.*, 2(7):679–689 (1992).

Munroe, R., "Method for Curing and Holding Semiconductors for Organic Encapsulation", *IBM Technical Disclosure Bulletin*, 27(7A):4037–4038 (Dec. 1984).

Saegusa, T. et al., "An organic/Inorganic Hybrid Polymer", *J. Macromol. Sci. Chem.*, A27:(13 & 14):1603–1612 (1990).

Volksen, W., "Condensation Polyimides: Synthesis, Solution Behavior, and Imidization Characteristics", *Advances in Polymer Science*, 117:138–139, 163 (1994).

Volksen, W. et al., "Polyamic Alkyl Esters: Versatile Polyimide Precursors for Improved Dielectric Coatings", *IEEE Transactions on Components, Hybrids and Manufacturing Technology* (IEEE Log. No. 9104490) (1992).

* cited by examiner

PROCESS FOR MANUFACTURE OF INTEGRATED CIRCUIT DEVICE USING INORGANIC/ORGANIC MATRIX COMPRISING POLYMERS OF THREE DIMENSIONAL ARCHITECTURE

FIELD OF THE INVENTION

The invention relates generally to a process for manufacturing an integrated circuit device. More specifically, the invention relates to the use of three dimensional polymers to create an insulative porous matrix material.

BACKGROUND OF THE INVENTION

There is a continuing desire in the microelectronics industry to increase the circuit density in multilevel integrated circuit devices e.g., memory and logic chips, thereby increasing their performance and reducing their cost. In order to accomplish this goal, there is a desire to reduce the minimum feature size on the chip e.g., circuit linewidth, and also to decrease the dielectric constant of the interposed dielectric material to enable closer spacing of circuit lines without increase in crosstalk and capacitive coupling. Further, there is a desire to reduce the dielectric constant of the dielectric materials such as utilized in the back end of the line (BEOL) portion of integrated circuit devices, which contain input/output circuitry, to reduce the requisite drive current and power consumption for the device. The present dielectric is silicon dioxide which has a dielectric constant of about 4.0. This material has the requisite mechanical and thermal properties to withstand processing operations and thermal cycling associated with semiconductor manufacturing. However, it is desired that dielectric materials for future integrated circuit devices exhibit a lower dielectric constant (e.g., <3.0) than exhibited by current silicon dioxide.

It is therefore an object of the present invention to provide an improved integrated circuit device comprising an improved dielectric material.

Other objects and advantages of the invention will be apparent from the following disclosure.

SUMMARY OF THE INVENTION

The present invention relates to a process for forming an integrated circuit device comprising (i) a substrate; (ii) interconnecting metallic circuit lines positioned on the substrate and (iii) a dielectric material positioned contiguous to the circuit lines (over and/or between the circuit lines). The dielectric material comprises a porous organic polysilica formed by the process of the present invention. Preferably, the dielectric material has pore sizes less than 500 Å.

A more thorough disclosure of the present invention is presented in the detailed description which follows and from the accompanying drawings.

DETAILED DESCRIPTION OF THE INVENTION

Figure 1:
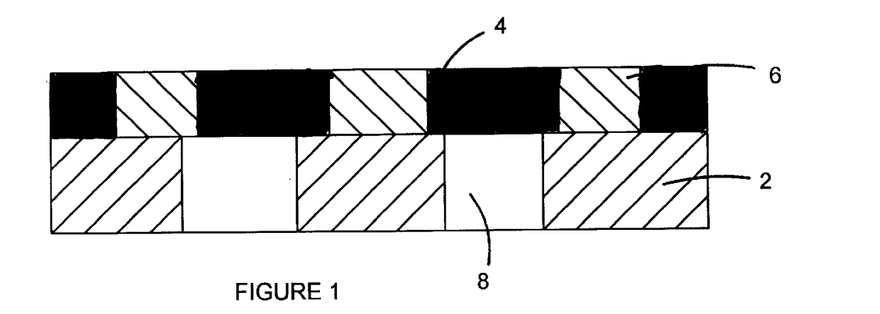
FIG. 1 is a cross-sectional view of a portion of the integrated circuit device formed by the process of the present invention.

An embodiment of the integrated circuit device formed by the process of the invention is shown in FIG. 1. The device generally comprises substrate 2, metallic circuit lines 4 and dielectric material 6. The substrate 2 has vertical metallic studs 8 formed therein. The interconnected circuit lines function to distribute electrical signals in the device and to provide power input to and signal output from the device. Suitable integrated circuit devices will generally comprise multiple layers of circuit lines which are interconnected by vertical metallic studs.

Suitable substrates for the device of the invention comprises silicon, silicon dioxide, glass, silicon nitride, ceramics, aluminum, copper, silicon/germanium, and gallium arsenide. Other suitable substrates will be known to those skilled in the art. In a multilayer integrated circuit device, an underlying layer of insulated, planarized circuit lines can also function as a substrate.

Suitable circuit lines generally comprise a metallic, electrically conductive, material such as copper, aluminum, tungsten, gold, silver, or alloys thereof. Optionally, the circuit lines may be coated with a metallic liner such as a layer of nickel, tantalum or chromium or other layers such barrier or adhesion layers (e.g., SiN, TiN).

An important feature of the invention is forming the dielectric material which is positioned over the circuit lines and/or between the circuit lines and on the substrate. In multilevel integrated circuit devices, the dielectric material is often planarized to function as a substrate for lithographic formation of the next layer of circuit lines. The dielectric material comprises porous organic polysilica.

Organic polysilica is a polymeric compound comprising silicon, carbon, oxygen and hydrogen atoms. Suitable organic polysilica include (i) silsesquioxanes (ii) partially condensed alkoxysilanes (e.g., partially condensed by controlled hydrolysis tetraethoxysilane having an Mn of about 500 to 20,000); (iii) organically modified silicates having the composition $RSiO_3$ and $R_2SiO_2$ wherein R is an organic substituent and (iv) partially condensed orthosilicates having the composition $Si(OR)_4$. Silsesquioxanes are polymeric silicate materials of the type $RSiO_{1.5}$ where R is an organic substituent or hydrogen.

Suitable organic polysilica include organic polysilica such as silsesquioxane. Suitable silsesquioxanes for the present invention are alkyl (e.g., methyl); aryl (e.g., phenyl) hydride or alkyl/aryl silsesquioxanes which are commercially available (e.g., GR950 from Techniglass, Perrysburg, Ohio). Other suitable silsesquioxanes will be known to those skilled in the art such as disclosed in U.S. Pat. No. 5,384,376, and Chem. Rev. 95, 1409–1430 (1995), the disclosure of which are incorporated herein by reference for all purposes.

The porous organic polysilica dielectric composition is formed in a three step process. The first step involves dissolving uncondensed or partially condensed organic polysilica in a suitable high boiling solvent (for example, DMAC, propylene glycol mono methylether, propylene glycol mono methylether acetate, γ-butyrolactone, cyclohexanone, cyclopentanone, y-methoxy propionate ethyl ester, and N-methyl-2-pyrrolidone, NMP) at room temperature and then uniformly dispersing in the solution a suitable decomposable polymer. The decomposable polymer is radiation decomposable or preferably thermally decomposable. The radiation decomposable polymer decomposes upon exposure to radiation e.g., ultraviolet, x-ray, electron beam or the like. The thermally decomposable polymer undergoes thermal decomposition at a temperature above the condensation temperature of the organic polysilica. Suitable decomposable polymers are those which actively promote templating of the polymerization and/or vitrification reaction, those which control and define pore size, and those which are fugitive at the appropriate time in the polymerization.

Polymers which have been found preferable include those having a branched or highly branched architecture which promotes a more three dimensional structure including star, graft, comb graft, randomly branched, hyperbranched, combburst, dendrimeric and combinations of these polymeric architectures with themselves and/or linear polymers, among others. Moreover these polymeric architectures may be composed of one or more type of monomer unit which results in homopolymers, random copolymers, gradient copolymers, and a variety of block copolymer structures such as di-, tri-, or multiblock copolymers.

Polymers which have been found preferable include those having an architecture which promotes a more branched three dimensional structure including block copolymers such as diblock, triblock, and multiblock copolymers; star block copolymers; radial diblock copolymers; graft diblock copolymers; comb grafted copolymers; dendrigraft copolymers; tapered block copolymers; and combinations of these polymeric architectures; among others.

Preferably the decomposable polymer comprises a copolymer having star architecture. Copolymers having star architecture are characterized by a nuclear configuration which is surrounded by an assortment of arms or branches radiating out from the core of the copolymer. The core of the copolymer may be an atom, a small molecule, or a star branched oligomer, among other alternatives. Star copolymers have been found preferred for a number of reasons. First, we have found copolymers with star architecture are easily processable in synthesis and application. However, more importantly, we have found that copolymers having star architecture provide superior correlation between the volume fraction of copolymer charged into the system and the ultimate porosity including pore size and distribution. We have found that copolymers with star architecture have nanoscopic domain sizes allowing for an almost homogenous distribution. Additionally, copolymers with star architecture tend to exhibit an absence of coalescense during processing. As a result, the copolymer forms discrete isolated volumes throughout the matrix. Copolymers with star architecture form regular discrete isolated volumes, providing predictable pore sizes.

A characteristic of these copolymers generally is complex, compact molecular geometries. The domain size of the copolymer preferably can be correlated to the ultimate pore size obtained. For example, with six-arm star copolymer a DP of about 4 to 6 provided phase domains of less than 100 Å, a DP of about 20–30 results in phase domains of about 250 to 750 Å, and a DP of 30 or greater results in a macro phase system. That is the volume of copolymer charged combined with copolymer domain size correlates to the ultimate pore size. Preferably, the pore size is less than about 500 Å, more preferably less than about 100 Å, and most preferably ranges about 30 Å to 50 Å. This smaller pore size allows the application of a more consistent environment from device to device. The decomposable polymers useful in the invention generally have a molecular weight (Mn) of less than about 20,000, preferably less than about 10,000, and more preferably about 5000 or less. Preferably, the resulting system comprises about 40 vol-% porosity or less and more preferably 25 to 20 vol-% porosity or less, the volume of porosity generally being substantially equivalent to the volume of fugitive polymer in the system before decomposition.

Suitable decomposable polymers include polyethers such as polypropylene oxide, polyacrylates such as poly(methyl methacrylate), aliphatic polycarbonates e.g., polypropylene carbonate, polyethylene carbonate, polyesters, polysulfones and polystyrene or poly (α-methyl styrene). These polymers preferably have reactive end groups or chain functionality which will react (co-condense) with the organic polysilica such as a triethoxysilane, hydroxy, carboxy, or amino groups. Other suitable copolymers include polystyrene or poly(methyl methacrylate); poly(styrene-ethylene oxide), poly(ether-lactones), poly(ester-carbonates) and poly (lactone-lactide); poly(caprolactone), polyethers e.g., polyethylene oxide or polypropylene oxide. Organic polymers of three dimensional architecture are highly branched, three-dimensional, macromolecules which have reactive groups at the chain ends with a substantial number of reactive groups along the outer surface of the macromolecule. Preferably, the surface reactive groups are condensable with the organic polysilica.

Preferably these polymers have low solution viscosity, high chemical reactivity due to surface functionality and enhanced solubility even at higher molecular weights. Suitable polymers for use in the present invention will be known to those skilled in the art such as disclosed in "Comprehensive Polymer Science", 2nd Supplement, Aggarwal, pages 71–132 (1996), the disclosure of which is incorporated herein by reference for all purposes.

In the second step of the process of the present invention, the mixture of the organic polysilica and decomposable polymer is heated to an elevated temperature e.g., directly or in a step wise fashion (e.g., 200° C. for 2 hrs. and then ramped up (5° C./min.) to 300° C. and held for 2 hrs.) to cause condensation of the organic polysilica and preferably cross condensation with the reactive groups of the thermally decomposable polymer. The heating in the second step is below the thermal decomposition temperature of the decomposable polymer. A catalyst may be utilized to lower the condensation temperature.

The last step of the process of the invention involves decomposing the decomposable polymer uniformly dispersed within the matrix of the condensed rigid organic polysilica. Photochemical labile polymers can be decomposed by exposure of the composition to suitable radiation to cause photodecomposition. Thermally decomposable polymer is decomposed by heating the composition to a temperature at or above the thermal decomposition temperature of the polymer. (e.g., about 350–400° C.)

The polymer decomposes to volatile fragments which diffuse out of the rigid polysilica matrix leaving voids behind. The pore size in the polysilica matrix will be generally approximately the same size as the size of the domains of the decomposable polymer and the pore size can be altered by varying the molecular weight of the decomposable polymer.

The dielectric composition of the invention has a dielectric constant less than about 3.2 and preferably less than about 2.8 at 25° C. The composition comprises about 10 to 40% by volume of pores and has pore sizes less than 500 Å, preferably less than 100 Å, which result in enhanced mechanical toughness and crack resistance and isotropic optical properties and improved dielectric properties.

Further, the dielectric composition has mechanical properties that resist cracking and enable it to be chemically/mechanically planarized to facilitate lithographic formation of additional circuit levels in multilevel integrated circuit devices. The dielectric composition has a dielectric strength from 1–5 MV/cm. The dielectric composition is optically clear and adheres well to itself and other substrates. The dielectric composition undergoes minimal shrinkage after removal of the solvent during heating. The composition of the invention can also be utilized as a protective coating for optical articles such as glasses, contact lens and solar reflectors and other articles used in outer space.

Application

Figure 2:
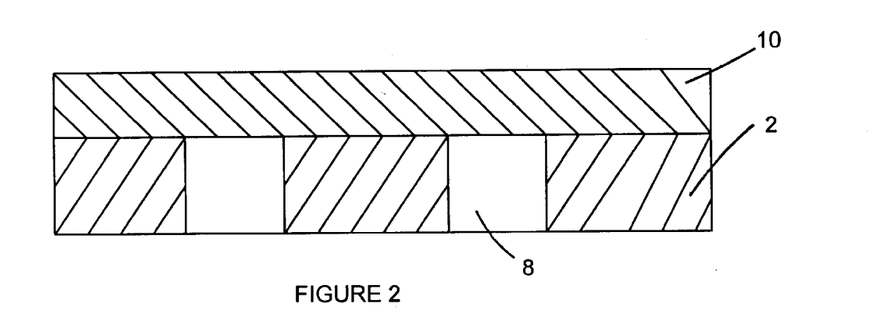
FIGS. 2–5 show a process for making the integrated circuit device of the present invention.

The invention relates to processes for manufacturing the integrated circuit device. Referring to FIG. 2, the first step of one process embodiment involves disposing on a substrate 2 a layer 10 of the dielectric composition of the invention comprising organic polysilica and decomposable polymer. The substrate 2 is shown with vertical metallic studs 8. The composition is dissolved in a suitable solvent such as dimethyl propylene urea (DMPU), NMP, PM acetate, PM alcohol, or the like and is applied to the substrate by art known methods such as spin or spray coating or doctor blading. The second step of the process involves heating the composition to an elevated temperature to cross condense the polysilica silyl reactive groups. Preferably, the composition is heated in the presence of a catalyst like an alkaline agent such as an amine or Bronsted base to lower the condensation temperature.

The base catalyzes both condensation extension of the polysilica and any cross condensation with the decomposable polymer enabling a lower initial cure temperature. Suitably, the base is an organic amine. The amine will preferably have a high boiling point and is removable by heating upon completion of the reaction. A suitable base is N-methyldiethanolamine. Other suitable bases will be known to those skilled in the art such as disclosed in U.S. Pat. No. 5,206,117, the disclosure of which is incorporated herein by reference for all purposes. The last step involves decomposing the decomposable polymer dispersed within the rigid polysilica matrix to form the porous polysilica.

Figure 3:
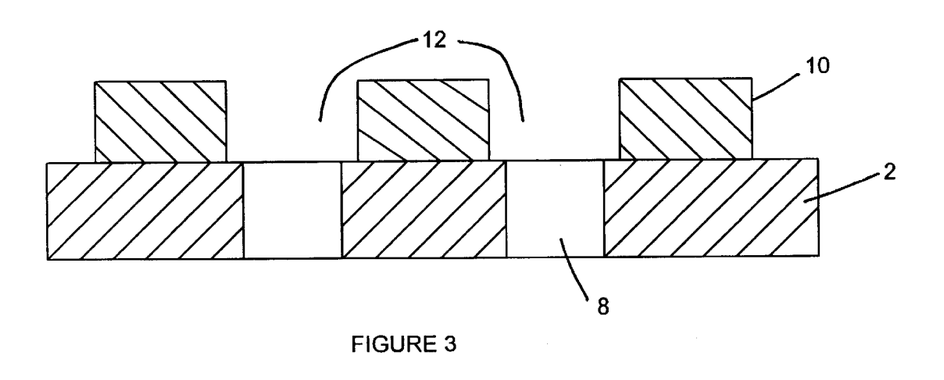

Referring to FIG. 3, the next step of the process involves lithographically patterning the layer 10 of dielectric composition to form trenches 12 (depressions) in the layer of composition. The trenches 12 shown in FIG. 3 extend to the substrate 2 and to the metallic stud 8. Lithographic patterning generally involves (i) coating the layer 10 of dielectric composition with a positive or negative photoresist such as those marketed by Shipley or Hoechst Celanese (AZ photoresist), (ii) imagewise exposing (through a mask) the photoresist to radiation such as electromagnetic e.g., visible UV or deep UV, (iii) developing the image in the resist e.g., with suitable basic developer and (iv) transferring the image through the layer 10 of dielectric composition to the substrate 2 with a suitable transfer technique such as reactive ion etching (RIE). Suitable lithographic patterning techniques are well known to those skilled in the art such as disclosed in "Introduction to Microlithography", Thompson et al., (1994), the disclosure which is incorporated herein by reference for all purposes.

Figure 4:
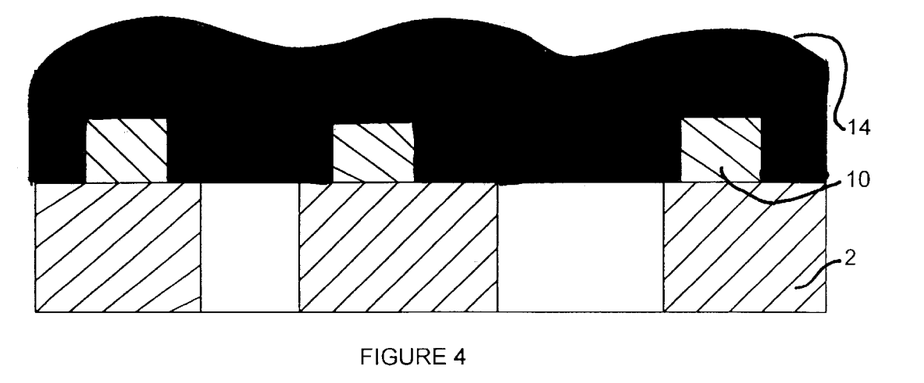

Referring to FIG. 4, in the next step of the process for forming the integrated circuit of the invention, a metallic film 14 (and removing excess metal) is deposited onto the patterned dielectric layer 10. Preferred metallic materials include copper, tungsten and aluminum. The metal is suitably deposited onto the patterned dielectric layer by art known techniques such as chemical vapor deposition (CVD), plasma enhanced CVD, electro and electroless deposition, sputtering or the like.

Figure 5:
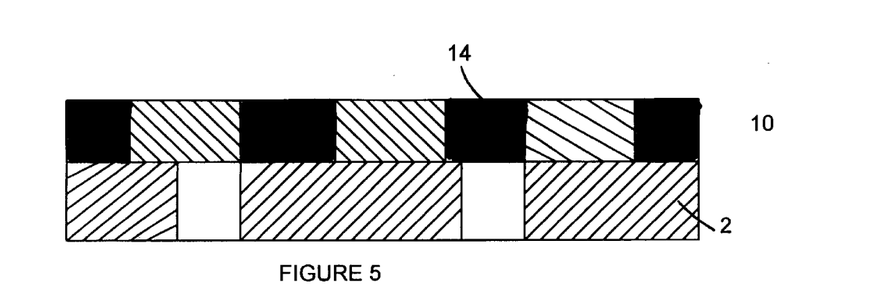

Referring to FIG. 5, the last step of the process involves removal of excess metallic material (e.g., planarizing the metallic film 14) so that the features 14 are generally level with the patterned dielectric layer 10. Planarization can be accomplished using chemical/mechanical polishing or selective wet or dry etching. Suitable chemical/mechanical polishing techniques will be known to those skilled in the art.

Figure 6:
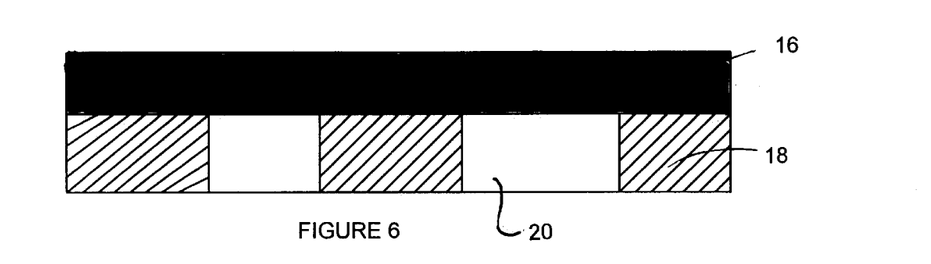
FIGS. 6–8 show an alternative process for making the integrated circuit device of the present invention.
Figure 7:
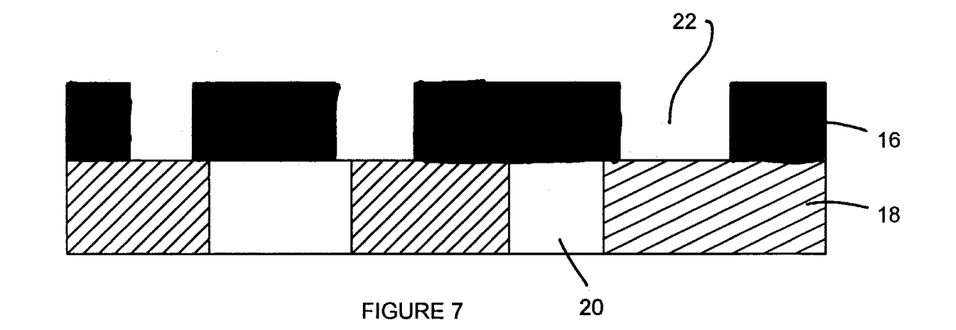
Figure 8:
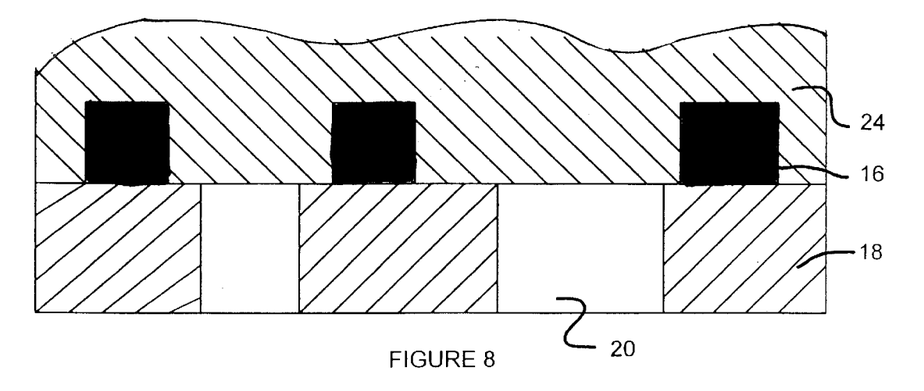

Referring FIGS. 6–8, there is shown an alternative embodiment of the process of the invention for making the integrated circuit devices. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the next step of the process, a layer 24 of dielectric composition of the present invention is deposited onto the patterned metallic film 16. In the last step of the process, the composition is heated first to condense the polysilica and then at a higher temperature to decompose the thermally decomposable polymer. Optionally, the dielectric layer may then be planarized for subsequent process in a multilayer integrated circuit.

WORKING EXAMPLES

The following examples are detailed descriptions of the process of the invention. The detailed preparations fall within the scope of, and serve to exemplify, the more generally described methods set forth above. The examples are presented for illustrative purposes only, and are not intended as a restriction on the scope of the invention.

Example 1

Star polymers suitable for incorporation into an inorganic matrix such as a silsequioxane can be formed from a range of polyfunctional alcohols, where the number of hydroxy functional groups is 3 or greater, by living ring opening polymerization of cyclic esters such as ε-caprolactone, or DL-lactide. As is exemplified in (I), below, each hydroxy group leads to a polyester chain and the number of chains, or arms of the star polymer is 3 or greater, with 4 to 6 being preferred:

The choice of the R group is alkyl, aryl, or a combination thereof, and R does not need to be symmetrically functionalized. R can also be a short linear oligomer or branched/star polymer, examples are hydroxymethyl functionalized polystyrene, hydroxyethyl functionalized poly(methyl methacrylate), or star branched poly(ethylene glycol), poly (propylene glycol). The molecular weight of the oligomer, R, can be 100 to 10,000, though preferable 200 to 1,500. One embodiment is the commercially available pentaerythritol ethoxylate, (II), which has 4 arms and an average of 3.75 ethylene oxide units per arm, number average molecular weight, M no is 797.

(II)

To formulate a star block polymer a mixture of pentaerythritol ethoxylate, (II), (11.49 g) ε-caprolactone (46.35 g), and toluene (100 ml) is heated at reflux in a Dean Stark apparatus for 2 hours and 20 mL of distillate removed. Stannous octanoate (8 drops) is then added and the mixture heated at reflux under argon for 14 hours, cooled and poured into ether (500 mL), the upper ether layer is decanted and the procedures repeated 2 times to give a waxy solid. This is then suspended in methanol 500 mL and filtered, three times and the white granular solid is finally dried under reduced pressure.

Another example of a star molecular architecture includes those derived from 2,2-bis (hydroxymethyl) propionic acid (bis-MPA). Bis(hydroxymethyl) derivates are effective initiators for the ring opening polymerization of cyclic esters (i.e., caprolactone, lactides and glycolides) using stannous octanoate as the organometallic promoter. One common core used as the initiator is the first generation hexahydroxy functional dendrimer of bis-MPA prepared by the reaction of an acetonide protected bis-MPA with 1,1,1-tris(p-hydroxyphenyl) ethane followed by deprotection.

-continued

Deprotection with hydrochloric acid gave the hexafunctional alcohol, (monomer (III)). This core served as an initiator for the ring opening polymerization of caprolactone and lactides in the presence of stannous dioctanoate using bulk conditions. Two grams of monomer (III) can be charged into the flask and rinsed into the flask with 60 mls of caprolactone. The reaction was heated to 100° C. and 1 drop of stannous dioctanoate was added. The reaction was complete in 20 hours. This gave a polymer with an average degree of polymerization of 20 per arm or approximately 15000 g/mol total. This polymer is readily soluble in solvents which are common spinning solvents for the PSSQ. The caprolactone star polymer is mixed with PSSQ and dissolved in PM acetate at 30% solids. Films may then be spun onto silicon wafers.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

The claimed invention is:

1. A process for forming an integrated circuit comprising:
   (a) positioning a layer of a dielectric composition, said dielectric composition comprising a decomposable polymer and an organic polysilica, said decomposable polymer having a three-dimensional star architecture, said decomposable polymer prepared by reacting a polyfunctional compound having at least three hydroxyfunctional groups with a cyclic ester wherein a star polymer having at least three arms is formed, on a substrate;
   (b) heating said composition to condense said polysilica;
   (c) decomposing said decomposable polymer;
   (d) lithographically patterning said dielectric layer;
   (e) depositing a metallic film onto said patterned dielectric layer; and
   (f) planarizing said metallic film to form an integrated circuit.

2. A process in accordance with claim 1 wherein said polyfunctional compound is an oligomer having a molecular weight of 100 to 10,000.

3. A process in accordance with claim 2 wherein said polyfunctional compound is an oligomer having a molecular weight of 200 to 1,500.

4. A process in accordance with claim 1 wherein said polyfunctional compound is selected from the group consisting of hydroxyethyl functionalized polystyrene, hydroxyfunctional poly(methyl methacrylate), star branched poly(ethylene glycol) and star-branched poly(propylene glycol.

5. A process in accordance with claim 1 wherein said polyfunctional compound is pentaerythritol ethoxylate.

6. A process in accordance with claim 5 wherein said cyclic ester is ε-caprolactone.

7. A process for forming an integrated circuit comprising:
   (a) depositing a metallic film on a substrate;
   (b) lithographically patterning said metallic film;
   (c) depositing a layer of a dielectric composition on said patterned metallic film, said dielectric composition comprising a decomposable polymer having a three-dimensional star architecture, said decomposable polymer prepared by reacting a polyfunctional compound having at least three hydroxyfunctional groups with a cyclic ester wherein a star polymer having at least three arms is formed, and an organic polysilica;
   (d) heating said dielectric composition to condense said polysilica; and
   (e) decomposing said decomposable polymer.

8. A process in accordance with claim 7 wherein said polyfunctional compound is an oligomer having a molecular weight of 100 to 10,000.

9. A process in accordance with claim 8 wherein said polyfunctional compound is an oligomer having a molecular weight of 200 to 1,500.

10. A process in accordance with claim 7 wherein said polyfunctional compound is selected from the group consisting of hydroxymethyl functionalized polystyrene, hydroxyfunctional poly(methyl methacrylate), star branched poly(ethylene glycol) and star branched poly(propylene glycol).

11. A process in accordance with claim 7 wherein said polyfunctionalized compound is pentaerythritol ethoxylate.

12. A process in accordance with claim 11 wherein said cyclic ester is ε-caprolactone.

13. An insulative matrix material useful in microcircuit applications comprising a product obtained by heating a decomposable polymer having a three-dimensional star architecture, said decomposable polymer prepared by reacting a polyfunctional compound having at least three hydroxyfunctional groups with a cyclic ester wherein a star polymer having at least three arms is formed, and an organic polysilica polymer wherein said organic polysilica condenses and said decomposable polymer forms a plurality of discrete volumes surrounded by a condensed polysilica matrix.

14. The material of claim 13, wherein after processing, the material has a porosity of about 10 to 40 vol-% porosity.

15. The material of claim 13, wherein after processing, the material has a porosity of about 25 vol-% porosity.

16. A material in accordance with claim 13 wherein said polyfunctional compound is pentaerythritol ethoxylate.

* * * * *